US010093203B1

(12) United States Patent
Lou et al.

(10) Patent No.: US 10,093,203 B1
(45) Date of Patent: Oct. 9, 2018

(54) SEATING SYSTEM WITH AUTOMATIC WEIGHT COMPENSATING ENERGY ATTENUATION

(71) Applicant: Armorworks Holdings, Inc., Chandler, AZ (US)

(72) Inventors: Ken-An Lou, Phoenix, AZ (US); Richard E. Zimmermann, Tempe, AZ (US); Ernest J Racette, Phoenix, AZ (US)

(73) Assignee: Armorworks Holdings, Inc., Chandler, AZ (US)

( * ) Notice: Subject to any disclaimer, the term of this patent is extended or adjusted under 35 U.S.C. 154(b) by 275 days.

(21) Appl. No.: 15/062,391

(22) Filed: Mar. 7, 2016

Related U.S. Application Data

(60) Provisional application No. 62/220,076, filed on Sep. 17, 2015.

(51) Int. Cl.
*B60N 2/427* (2006.01)
*B60N 2/42* (2006.01)

(52) U.S. Cl.
CPC ....... *B60N 2/42736* (2013.01); *B60N 2/4242* (2013.01)

(58) Field of Classification Search
CPC ............ B60N 2/42727; B60N 2/42736; B60N 2/42772; B60N 2/42781; B60N 2/4279; B64D 11/0619
See application file for complete search history.

(56) References Cited

U.S. PATENT DOCUMENTS

| | | | |
|---|---|---|---|
| 4,509,621 A | 4/1985 | Desjardins et al. | |
| 5,273,240 A * | 12/1993 | Sharon | B60N 2/4242 188/271 |
| 5,822,707 A * | 10/1998 | Breed | B60R 21/01512 701/49 |
| 7,445,181 B2 * | 11/2008 | Knoll | B60N 2/4242 244/122 R |
| 8,162,374 B2 * | 4/2012 | Cantor | B60N 2/4242 296/65.02 |

(Continued)

OTHER PUBLICATIONS

S. P. Desjardins, Aircraft Crash Survival Design Guide, vol. IV—Aircraft Seats, Restraints, Litters, and Cockpit/Cabin Delethalization, Final Report prepared for US Army Aviation Applied Technology Directorate, Fort Eustis, VA, Dec. 1989.

(Continued)

*Primary Examiner* — Timothy J Brindley
(74) *Attorney, Agent, or Firm* — James L Farmer

(57) ABSTRACT

Methods and apparatus are provided for a self adjusting energy attenuating vehicle seating system configured to automatically compensate for variations in the weight of seated occupants. A seat is mounted in a vehicle and configured to stroke in a downward direction, generally toward a floor of the vehicle, with an adjustable energy attenuating device disposed in a load path between the seat and a rigid structural portion of the vehicle. A signal processor removes variations in a seat weight signal attributable to vehicle or occupant motion, and outputs an energy attenuator adjustment signal corresponding to the weight of a seated occupant. The system may further include an actuator configured to receive the energy attenuator adjustment signal and adjust a load setting feature of the energy attenuating device accordingly.

24 Claims, 9 Drawing Sheets

(56) References Cited

U.S. PATENT DOCUMENTS

| | | | | |
|---|---|---|---|---|
| 8,182,044 B2* | 5/2012 | Mullen | ............... | B60N 2/24 |
| | | | | 188/371 |
| 8,342,300 B2* | 1/2013 | Guillon | ............... | B60N 2/24 |
| | | | | 188/275 |
| 8,910,761 B2* | 12/2014 | Friedrich | ............... | B60R 19/34 |
| | | | | 188/372 |
| 8,979,194 B2* | 3/2015 | Boomgarden | ......... | B64D 11/06 |
| | | | | 297/217.1 |
| 9,272,657 B1* | 3/2016 | Perciballi | ................ | B60P 7/13 |
| 9,382,008 B2* | 7/2016 | Fornecker | .......... | B64D 11/0619 |
| 9,822,923 B2* | 11/2017 | Woodbury, II | ....... | F16M 11/24 |
| 2006/0176158 A1* | 8/2006 | Fleming | ............. | B60R 16/0232 |
| | | | | 340/425.5 |
| 2007/0188053 A1* | 8/2007 | Stark | ................... | B60C 23/041 |
| | | | | 310/339 |
| 2007/0290535 A1* | 12/2007 | Meredith | .......... | B60N 2/42736 |
| | | | | 297/217.1 |
| 2008/0015753 A1* | 1/2008 | Wereley | ............... | B60N 2/4242 |
| | | | | 701/45 |
| 2008/0156602 A1* | 7/2008 | Hiemenz | ............. | B60N 2/4242 |
| | | | | 188/267.1 |
| 2009/0005936 A1* | 1/2009 | Browne | ............. | B60R 25/1004 |
| | | | | 701/45 |
| 2009/0105910 A1* | 4/2009 | Scully | ............... | B60N 2/42727 |
| | | | | 701/49 |
| 2010/0148519 A1* | 6/2010 | Shih | ................... | H01L 41/1136 |
| | | | | 290/1 R |
| 2010/0179730 A1* | 7/2010 | Hiemenz | ............. | B60N 2/4242 |
| | | | | 701/45 |
| 2010/0332079 A1* | 12/2010 | Wang | ................... | B60N 2/4242 |
| | | | | 701/37 |
| 2011/0035118 A1* | 2/2011 | Hiemenz | ............. | B60N 2/4242 |
| | | | | 701/45 |
| 2011/0204685 A1* | 8/2011 | Dock | ................ | B64D 11/0689 |
| | | | | 297/216.1 |
| 2011/0233975 A1* | 9/2011 | Mindel | ................... | B60N 2/24 |
| | | | | 297/216.17 |
| 2013/0060428 A1* | 3/2013 | Battlogg | ............. | B60N 2/0276 |
| | | | | 701/45 |
| 2013/0082657 A1* | 4/2013 | Rich | ................... | H01L 41/1136 |
| | | | | 320/114 |
| 2015/0083196 A1* | 3/2015 | Gray | ....................... | H02N 2/18 |
| | | | | 136/248 |
| 2016/0121765 A1* | 5/2016 | Desjardins | ............. | B60N 2/24 |
| | | | | 701/49 |

OTHER PUBLICATIONS

G. Mikulowski, Advanced Landing Gears for Improved Impact Absorption, Actuator 2008, 11th International Conference on New Actuators, Bremen, Germany, Jun. 9-11 2008.

Vinod R Challa, A Vibration Energy Harvesting Device with Bidirectional Resonance Frequency Tunability, Smart Materials and Structures, vol. 17, Jan. 8, 2008, online at stacks.iop.org/SMS/17/015035.

Craig M. Svoboda, Design and Development of Variable-Load Energy Absorbers, Simula Inc., Final Report prepared for Naval Air Development Center, Warmisnter, PA, Jun. 16, 1981.

James C. Warrick, Design and Development of Automatically Controlled Variable-Load Energy Absorber, Simula Inc., Final Report prepared for Naval Air Systems Command, Washington DC, Mar. 1984.

* cited by examiner

SEATING SYSTEM WITH AUTOMATIC WEIGHT COMPENSATING ENERGY ATTENUATION

Provisional Patent Application Ser. No. 62/220,076, to which the present application claims priority, is hereby incorporated by reference.

TECHNICAL FIELD

The technical field of the present invention relates to energy attenuating aircraft and ground vehicle seats. The technical field further relates to energy attenuating seats that self-adjust based on occupant weight, and to vehicle electrical power systems.

BACKGROUND

Energy attenuating ("EA") seats in military vehicles and aircraft account for by far most of the EA seats in use to date, and most of those have fixed-load, or non-adjustable energy attenuators. While offering considerable crash and blast protection compared to the prior non-energy attenuating seats, protection for the so-called 5th and 95th percentile occupants as well as the 50th percentile occupant of non-adjustable seats has been less than adequate. In particular, 5th percentile occupants are subjected to higher than acceptable G loads with a corresponding higher risk of injury, while 95th percentile occupants risk injury caused by impact with the vehicle floor due to inefficient use of the available stroke distance and incomplete energy attenuation.

To address these shortcomings, various manually adjustable, weight compensating energy attenuators were developed. Such systems generally require the seat occupant to manually adjust a weight setting, either prior to or after sitting down in the seat. The selected weight setting defines a corresponding threshold load that will cause the seat to stroke during a crash or blast event, with the goal of using all of the available stroking distance regardless of seat occupant weight to absorb the crash or blast energy. While feasible in a helicopter seat application where the crew generally has time to follow a checklist prior to takeoff, manually adjustable systems are not well suited to military ground vehicle application. The typical operating environment for military ground vehicles dictates a system that minimizes or eliminates any increase to the soldier's existing logistical burden. Therefore a need was recognized for an EA system that self adjusts to automatically account for differences in occupant weight.

Various attempts to provide such a system have been proposed, including for example a wire-bender based system described in U.S. Pat. No. 8,182,044, a tube-flattening (or crushing) based system described in U.S. Pat. No. 5,273,240, and a variable force linkage system described in U.S. Pat. No. 5,558,301. These systems utilize a mechanical connection from the EA device to the seat that operates to physically adjust a load controlling portion of the EA device when a load is placed in the seat, and maintain the adjustment until the load is removed.

A complication arises however when the seat loading varies, as naturally occurs when the vehicle begins to move, and in particular when driven over uneven terrain. Attempts to compensate for vehicle motion induced load variation have been largely unsatisfactory, often resulting in increased complexity of the mechanism, and in some cases requiring additional operator input to lock or release the adjustment device. Thus a need exists for a reliable, truly automatic weight compensating EA system for use in ground vehicles.

DESCRIPTION OF THE EMBODIMENTS

The instant invention is described more fully hereinafter with reference to the accompanying drawings and/or photographs, in which one or more exemplary embodiments of the invention are shown. This invention may, however, be embodied in many different forms and should not be construed as limited to the embodiments set forth herein; rather, these embodiments are provided so that this disclosure will be operative, enabling, and complete. Accordingly, the particular arrangements disclosed are meant to be illustrative only and not limiting as to the scope of the invention. Moreover, many embodiments, such as adaptations, variations, modifications, and equivalent arrangements, will be implicitly disclosed by the embodiments described herein and fall within the scope of the present invention.

Although specific terms are employed herein, they are used in a generic and descriptive sense only and not for purposes of limitation. Unless otherwise expressly defined herein, such terms are intended to be given their broad ordinary and customary meaning not inconsistent with that applicable in the relevant industry and without restriction to any specific embodiment hereinafter described. As used herein, the article "a" is intended to include one or more items. Where only one item is intended, the term "one", "single", or similar language is used. When used herein to join a list of items, the term "or" denotes at least one of the items, but does not exclude a plurality of items of the list.

For exemplary methods or processes of the invention, the sequence and/or arrangement of steps described herein are illustrative and not restrictive. Accordingly, it should be understood that, although steps of various processes or methods may be shown and described as being in a sequence or temporal arrangement, the steps of any such processes or methods are not limited to being carried out in any particular sequence or arrangement, absent an indication otherwise. Indeed, the steps in such processes or methods generally may be carried out in various different sequences and arrangements while still falling within the scope of the present invention.

Additionally, any references to advantages, benefits, unexpected results, or operability of the present invention are not intended as an affirmation that the invention has been previously reduced to practice or that any testing has been performed. Likewise, unless stated otherwise, use of verbs in the past tense (present perfect or preterit) is not intended to indicate or imply that the invention has been previously reduced to practice or that any testing has been performed.

Figure 1:
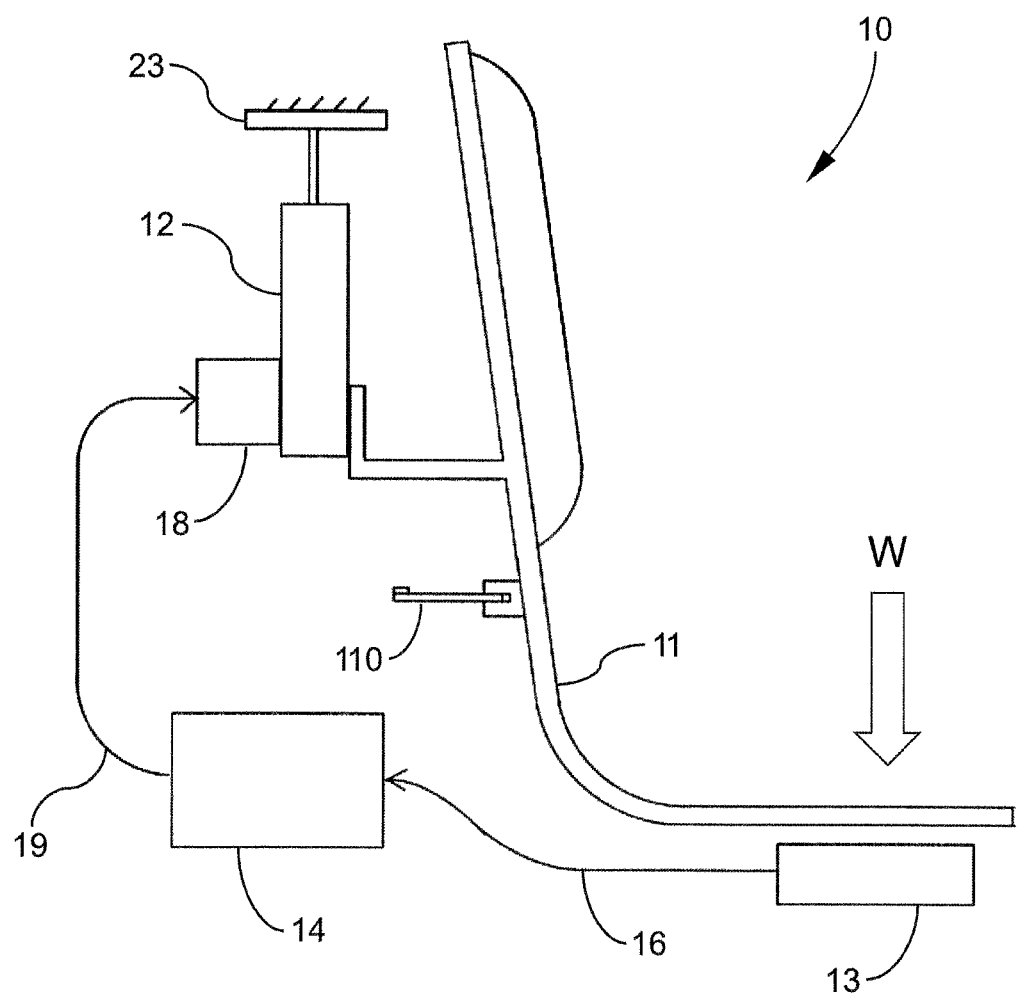
FIG. 1 is schematic depiction of an exemplary weight compensating energy attenuating seating system in accordance with the present disclosure.

Referring now to the drawings, an exemplary seating system in accordance with the present disclosure is schematically represented in FIG. 1 and indicated generally at reference numeral 10. The seating system 10 consists of a seat 11, an adjustable energy attenuating (EA) mechanism 12 disposed between the seat 11 and vehicle structure 23 (or between the seat and a fixed seat frame), a weight detector 13 responsive to the presence and weight of an occupant in the seat; a signal processor 14 configured to receive a real time weight signal from the weight detector and output an adjustment signal 19; an actuator 18 configured to convert the adjustment signal 19 into mechanical motion; and a moveable stop 20 (see FIGS. 2 through 4) connected to the actuator 18.

Figure 2:
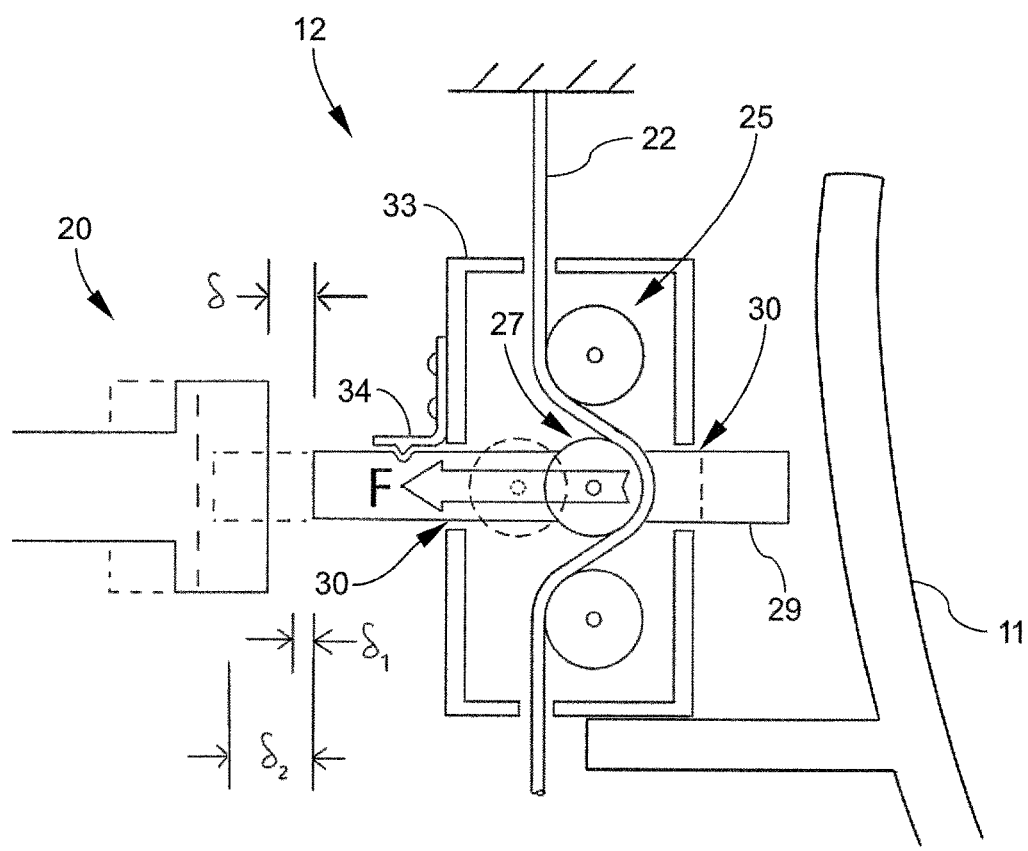
FIG. 2 is a schematic depiction of an exemplary wire-bender type adjustable energy attenuating mechanism in accordance with the present disclosure.

EA devices associated with vehicle and aircraft seats come in various forms, most commonly as devices that attenuate energy by permanently (or plastically) deforming metal. Some well known examples of the metal deformation types include tube inversion, tube flattening, bendable rod or "link", and wire bending devices. The EA mechanism depicted herein beginning with FIG. 2 is intended to represent the wire (or strip) bending type, in which energy attenuation occurs as an elongated metal bar (or wire) is pulled through a series of rollers. As is the case for all metal deformation EA types, a wire bending device is configured to prevent any deformation or movement from occurring until the applied load exceeds some pre-determined threshold value typically associated with a crash or blast event. Adjustability for the purpose of compensating for occupant weight variation is obtained by manually adjusting a threshold load setting feature, typically an adjustable portion that controls the amount of deformation of the plastically deformable member that must occur for the seat to begin to stroke. In the case of a wire bending device, the deformation controlling feature is typically one of the rollers, and the threshold force may be conveniently adjusted by simply moving the adjustable roller to vary the alignment, or offset of the rollers. Similarly, in a tube flattening or crushing type EA device, the deformation controlling feature is a constriction or mandrel, sometimes with rollers, and the threshold force may be adjusted by varying the size of the constriction that the tube is forced through.

While the system of the present invention is described in detail using as an example a wire bending type EA mechanism in which an initial gap is created between an adjustable stop and a moveable roller of the EA device, the system applies to any metal deformation type of EA device. For example, in a device that uses multiple indenting rollers positioned around a tube, the stop may comprise an adjustable diameter ring that constrains the rollers from moving away from the tube. As explained in greater detail below using the wire bending type example, until the system is activated by a catastrophic loading event, a gap separates the stop component from the moveable, deformation controlling feature of the EA mechanism. Because of this gap, the stop is freely moveable and adjustable by the system without interference or resistance from the EA device, regardless of the particular EA mechanism involved.

The present system automatically accounts for the seat occupant's weight for purposes of setting the stop position and initial gap, without any action or input by the occupant using the aforementioned weight detector 13, signal processor 14, and actuator 18. The process of determining occupant weight and setting the gap begins at weight detector 13. At least some portion of the weight detector may be physically connected to the seat, or to a seat pan, and configured to receive a continuous, or real time input seat weight force or pressure produced by a person occupying the seat, or by the seat and occupant combined. The seat weight force may comprise the entire weight of the seat or seat occupant, or some proportional amount. The weight detector operates to convert the input seat weight force or pressure to a real time weight signal 16.

The specific nature of the weight signal 16 may vary depending upon the nature of the weight detector and the overall system. For example, the automatic system may be electronic, in which case the weight signal 16 may be an electrical signal. Alternatively, the system may be fluid based, in which case weight signal 16 may be a hydraulic pressure. Regardless, the weight signal 16 is proportional in real time to the force or pressure produced by the seat or seated occupant, including increases and decreases in the seat weight force that may occur when the occupant initially sits down, or as a result of accelerations caused by vehicle operation.

The output from the weight detector is input to a signal processor 14 configured to generate an energy attenuator adjustment signal 19 corresponding to a static or motionless weight of the seated occupant. In other words, a weight that excludes variations due to vehicle motion or movement of the occupant, hereinafter referred to simply as the "occupant weight", or the "weight of the seated occupant". Again depending upon the nature of the overall system, such as electronic or mechanical, the signal processor may perform one or several functions to generate the adjustment signal 19. For example, the signal processor may simply operate as a low pass filter that removes high frequency variations from the weight signal. Alternatively, the signal processor may be configured to determine the weight of a seated occupant, and produce an energy attenuator adjustment signal based on that weight. In an electronic system for instance, the signal processor may include a filter, an algorithm configured to determine an occupant weight, and a look-up table to select an EA adjustment instruction.

The EA adjustment signal 19 from the signal processor is input to the actuator 18. Using the adjustment signal, the actuator 18 then operates to adjust the load setting feature of the EA system so as to account for the weight of the seat occupant. A power source may or may not be required to operate the actuator and other system elements depending again on the nature of the overall system.

FIG. 2 schematically depicts a three-roller adjustable wire bending type EA device 12 in which a center roller 27 is mounted on a slider 29 guided by openings 30 in opposite sides of EA housing 33. The rollers define a serpentine path for a deformable metal rod 22, causing it to yield and permanently deform several times as it passes through the rollers, or as the rollers are pulled along the bar. Bar 22 may be round, square, or flat in cross section, and is typically referred to as a wire, strip, bar, or rod, any of which may be used here interchangeably to mean element 22 of the drawings. In EA seat applications, the metal rod is usually fixed at an upper end to a seat frame or vehicle structure, while the rollers are attached to the seat and move with it as the seat strokes downward during a crash or blast event.

The slider 29 and center roller 27 are moveable laterally between a first position shown in solid lines that corresponds to a minimum roller offset, and a second position shown in dashed lines that corresponds to a maximum roller offset. On installation the slider 29 and roller 27 are in the first position (minimum roller offset), and bar 22 is pre-bent to fit around the center roller 27 in the manner shown. The amount that the bar 22 must deform, and thus the load required to pull the bar 22 through the rollers (the threshold load) in the first position are both at a maximum. Conversely, with the slider and roller in the second position (maximum roller offset), the bar deformation and threshold load are both at a minimum. Thus as the roller offset increases, the threshold load decreases, and vice versa. In that sense the roller offset and the threshold load are inversely proportional to one another.

When enough force is applied to bar 22 to pull it through the rollers, such as in a blast event, the bar will attempt to straighten, and in so doing exert a lateral force (indicated by arrow 'F') on the center roller 27. The lateral force F will tend to move the center roller 27 and slider 29 in the direction of increasing offset, or from right to left in FIG. 2. The amount of movement possible may be controlled and defined using an adjustable stop 20 to set an initial gap δ between the stop and the end of the slider. The initial gap δ may be set at any desired amount. If the initial gap is set at zero, the slider 29 will not be able to move at all when subjected to the lateral force F. In that case the bar deformation and the threshold force are maintained at their first position, maximum values. Conversely, the larger the initial gap, the farther the slider 29 will move before hitting the stop, the greater the roller offset, and the lower the threshold force.

An object of the present system is to provide a means for adjusting the threshold force to an appropriate level for a given seat occupant weight to ensure that the seat strokes the same distance in a crash or blast event regardless of occupant weight. Referring still to FIG. 2, in one embodiment the initial gap δ is adjustable between a non-zero minimum gap $\delta_1$ associated with a maximum anticipated occupant weight; and a maximum gap $\delta_2$ associated with a minimum anticipated occupant weight. Because the minimum gap is not zero, the slider 29 and stop 20 are by definition never in contact when the stop is being moved to establish or adjust the initial gap. Thus under sub-threshold loading conditions, the stop is always freely movable and adjustable without being subjected to external forces or friction, such as from the bar and roller mechanism of an adjustable wire bender device.

To ensure that the slider does not interfere with the stop, the mechanism may include a temporary restraint 34 configured to hold the slider in the first position under sub-threshold loading conditions, and yet readily release the slider when subjected to a lateral load by a deforming bar 22. The temporary restraint may be of a detent type that uses friction to secure the slider such as the flexible clip configuration shown, or a more positive configuration such as a shear pin and the like.

Figure 3:
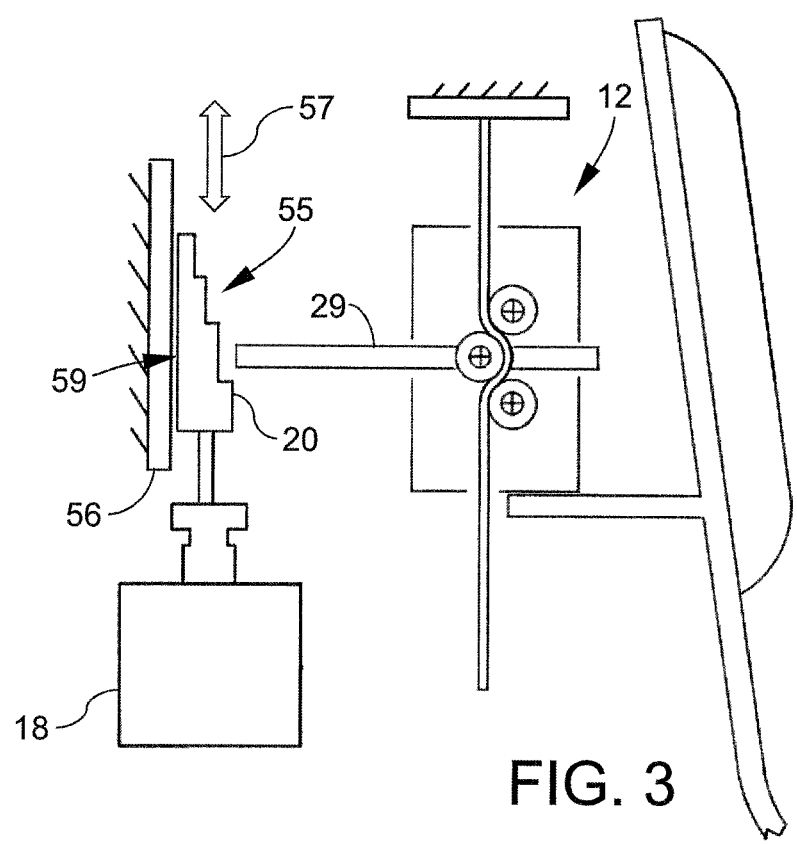
FIG. 3 illustrates an alternative configuration of the energy attenuating mechanism of FIG. 2 in which an adjustable stop moves in a perpendicular direction to a moveable roller of the energy attenuating mechanism.
Figure 4:
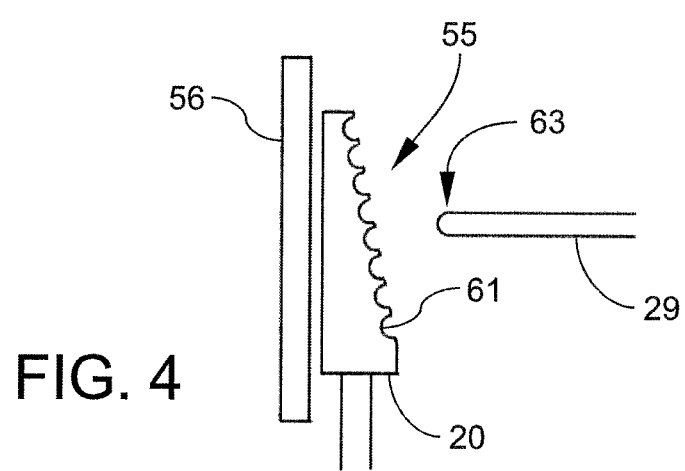
FIG. 4 illustrates an alternative configuration of the adjustable stop of FIG. 3.

The arrangement, orientation, and movement direction of the actuator, stop, and EA mechanism may take various configurations. In the embodiment of FIGS. 1 and 2, the actuator 18 is oriented to move the stop 20 along a longitudinal axis directly toward or away from the end of slider 29. FIG. 3 schematically depicts an alternative configuration in which the actuator is rotated 90 degrees to move the stop 20 in a direction perpendicular to the path of slider 29. The direction of motion is indicated by arrow 57. In this embodiment the stop 20 may have a wedge shape as shown, with the wedge oriented so that an angled side 55 is juxtaposed with the end of slider 29. Thus by extending or retracting the stop with the actuator, the size of the initial gap between the slider and the side 55 of stop 20 may be adjusted.

The stop may be guided and supported by a fixed housing member 56 positioned behind a straight side 59 of stop 20 opposite the angled side 55. The housing member 56 provides a straight surface or channel aligned with the direction of motion of the stop 20. Housing member 56 may for example be a portion or extension of EA housing 33 that also supports actuator 18 and control elements such as signal processor 14. An advantage to the configuration of FIG. 3 is that the load imparted to the stop by the slider 29 during a high load event presses the stop against housing member 56, rather than against actuator 18. Because the actuator is effectively removed from the load path, it need not be designed to carry the potentially high direct load from the EA mechanism.

The angled side 55 of stop 20 may have a stepped shape as shown in FIG. 3, presenting a series of flat surfaces to slider 29. In another embodiment shown in FIG. 4, side 55 presents a series of dish-shaped, or semicircular recesses 61. In this embodiment the slider 29 of the EA device may have a rounded end 63 sized to fit the recesses 61. In either case, whether flat steps or semicircular recesses, the angled surface 55 provides a series of incremental initial gap sizes between the stop and slider. Alternatively, angled side 55 may be a completely smooth incline without steps or recesses, to provide a continuous or infinite initial gap size adjustment. In that case the incline angle of side 55 with respect to the straight side 59 should be less than approximately 7 degrees to avoid excessive side loading on slider 29.

Figure 5:
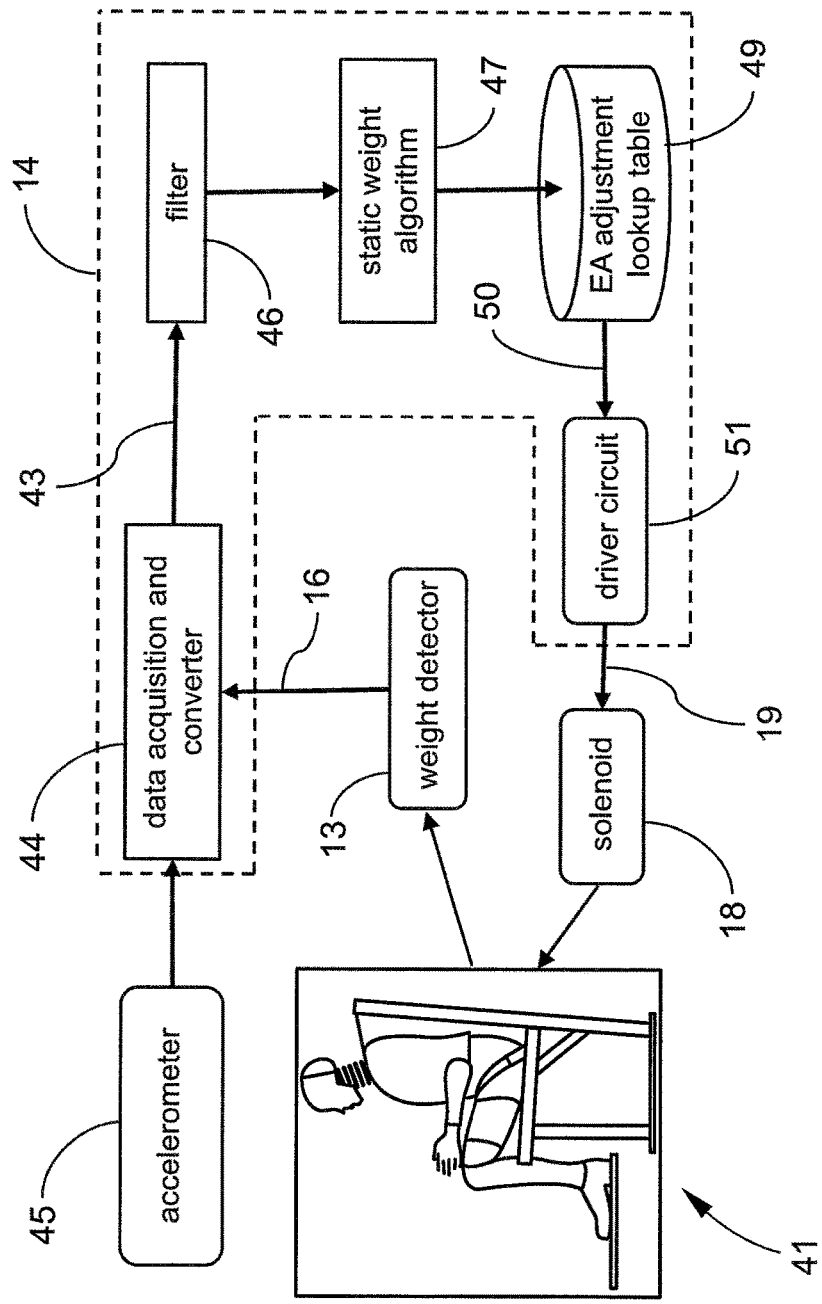
FIG. 5 depicts in block diagram form an exemplary electronic embodiment of the automatic energy attenuating seating system.

FIG. 5 schematically depicts in block diagram form an exemplary electronic embodiment of the automatic EA seating system. The portions of FIG. 5 corresponding to the previously identified system elements, such as weight detector 13, weight signal 16, signal processor 14, and so on are indicated, with dashed lines used to denote groupings of blocks that correspond to a single previously defined system element. In the depicted embodiment the weight of a seated occupant 41 is detected by weight detector 13 that sends an analog electronic weight signal 16 to the signal processor 14. The weight detector 13 may be an electronic sensor or transducer configured to convert a physical force or pressure into an electronic signal.

The installation and configuration of the weight sensor may take various forms depending upon the design of the stroking seat and the EA mechanism. For example in a system in which the seat is directly supported by the EA system, the sensor may be located within a load path between the seat and the EA device, or between the EA device and the supporting vehicle structure 23. In those configurations the sensor detects the entire weight of the seat and the seated occupant. Alternatively, the sensor may comprise one or more electronic sensing devices built into or under a seat pan portion of the seat that sense the weight of an occupant, independent of the seat weight.

One example of a commercially available device suitable for use as weight detector 13 is a load cell manufactured by Measurement Specialties of Hampton, Va. The load cell is made in a silicon fused on glass process for use in commercial products such as bathroom scales. Other suitable devices include a Delphi silicone-filled bladder system which measures pressure to infer an occupant weight category or range, a Gagetek/BF Goodrich system which uses torsion-sensing load cells mounted on the corners of the seat, and a Sensata piezoelectric-wire sensor that measures deflection due to the presence of the occupant. The sensor or sensors may further comprise devices configured to detect the small displacement of a flexure designed into the load path, or various adaptations of existing automotive technology.

The weight signal 16 from the sensor is output to the signal processor 14, and more particularly to a data acquisition and converter unit 44. The data acquisition and converter unit 44 may be configured to receive additional input signals, such as an acceleration signal from an optional accelerometer 45 attached to the seat or in the vehicle. The accelerometer may be utilized to facilitate enhanced detection of conditions that would tend to affect the apparent sensed load on the seat, such as when the vehicle is undergoing maneuvers or travelling over rough terrain. For example, by comparing accelerometer data to the weight sensor output, seat load variations that are not due to vehicle motion, such as the initial impulse caused by sitting on the seat or abnormal occupant motion, may be more readily identified.

The data acquisition and converter unit 44 outputs an unfiltered digital signal 43 that contains the real time seat weight data, as well as any additional data, such as acceleration information. The unfiltered signal 43 is received and processed by a digital filter 46 that removes artifacts in the signal attributable to vehicle or occupant motion. For example, filter 46 may operate as a low-pass filter that removes variations in the incoming unfiltered signal that are outside a pre-defined cut-off frequency range. The cut-off frequency could be selected to be below the frequency range associated with most vehicle motion induced load variations. Alternatively, filter 46 may operate as a nonlinear filter configured to continuously or incrementally calculate and output a median signal value. In any case the filter outputs a signal that relates to and may be correlated to the weight of the seated occupant.

The filtered weight signal, which may be a single value or a range, is then further processed within signal processor 14 to produce the EA adjustment signal for input to the actuator 18. The additional processing may include a static weight algorithm 47 that determines a weight value for the seated occupant from the filtered weight signal, and a look-up table 49 that operates to select and output an adjustment instruction 50 based on the calculated occupant weight value. The static weight algorithm 47 may also be configured to convert a filtered weight signal based on a combined seat and occupant weight to a weight of just the seated occupant. The adjustment instruction 50 goes to a driver circuit 51 configured to output the EA adjustment signal 19 in the form of a voltage signal.

The actuator 18 receives the voltage signal and positions the stop 20 accordingly to provide the appropriate initial gap δ for the particular seated occupant. The actuator 18 may be a commercially available solenoid (or servo) device. Suitable rotary solenoid devices are available for example from Impulse Automation, headquartered in the United Kingdom, through their website "thesolenoidcompany.com". It should be appreciated that some or all of the above described electronic system elements, such as the elements comprising signal processor 14, may be physically grouped together as components of a control board, as software or firmware elements in a CPU or computer, or as a stand-alone CPU, laptop, or other fixed or mobile computing device.

Figure 6:
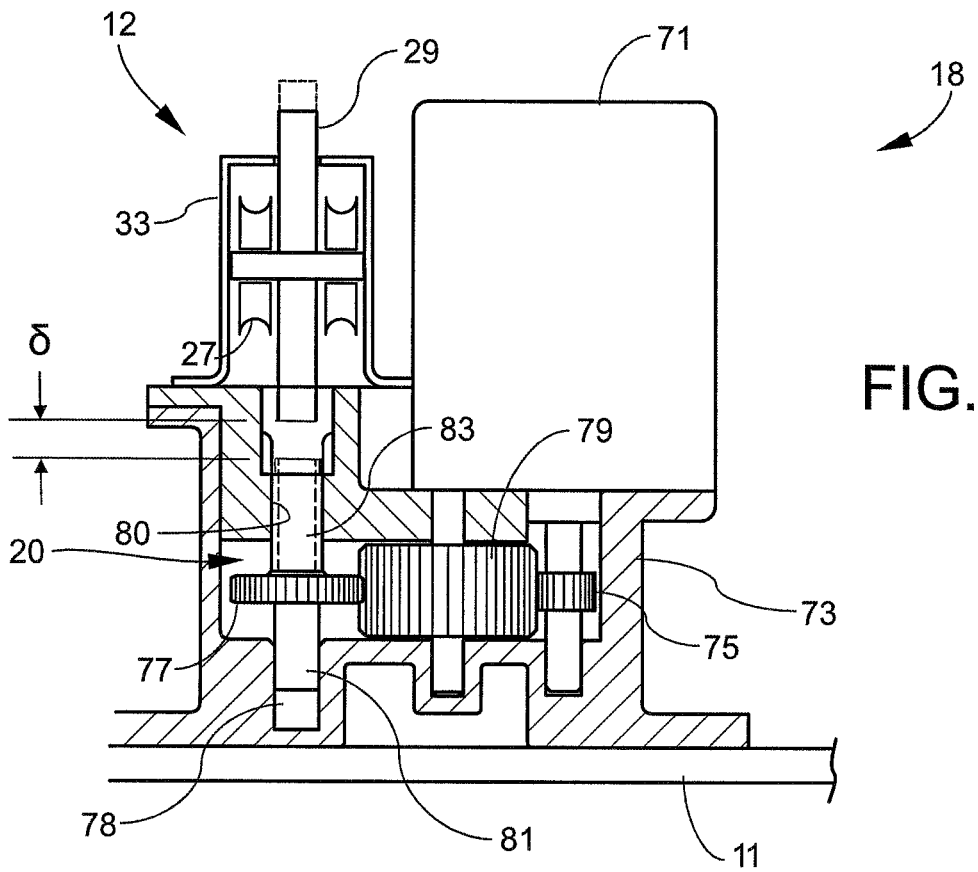
FIG. 6 is a cross section of an integral actuator and gear driven adjustable stop.

FIG. 6 depicts one exemplary packaging arrangement of the actuator 18, stop 20, and adjustable wire bending type EA mechanism 12 for an electronic embodiment of the system. The view depicted is a horizontal cross section in which the deformable metal rod 22 (not shown) would pass through the EA mechanism in a direction perpendicular to the plane of the drawing, and parallel to the stroking direction of the seat. A motor (or servo) 71 and an EA housing 33 are mounted next to each other on an actuator housing 73 that is in turn attached to and moveable with the seat 11. A shaft gear 75 on the motor 71 rotates an idler gear 79 that rotates a stop gear 77 on the stop 20. The stop gear is attached to, or integral with stop 20 such that rotating gear 77 also rotates the stop. The stop 20 has an inner shaft 81 that extends from gear 77 toward seat 11 into an inner bore 78 of housing 73, and a threaded outer shaft 83 that extends from gear 77 toward slider 29 of EA mechanism 12 and into a threaded outer bore 80 of housing 73. Thus when the stop is rotated via the electric motor and gears, the outer shaft 83 screws in or out of the threaded outer bore 80, causing the stop to move toward or away from the slider 29, and thereby adjusting the initial gap δ.

The electronic EA adjustment system need not operate continuously. In one embodiment the system is initially in a stand-by mode, and activated by the weight detector 13 when a person first sits down on the seat. The system then proceeds through the above described process of determining an occupant weight and positioning the EA mechanism, after which the system goes into a sleep mode. The determination of the occupant weight may occur while the vehicle is stationary or when moving.

Once in sleep mode, the system is programmed to ignore further variations in the seat weight signal due to vehicle motion or movement of the occupant within the seat. The system will remain in sleep mode until conditions occur that are consistent with the seat being vacated. For example, the system may be programmed to monitor the seat weight signal from the weight detector 13 and recognize when it goes substantially to zero for a sufficient pre-determined length of time indicative of the seat having been vacated. Upon determining that the seat has been vacated, the system may be configured to come out of sleep mode, and reset to stand-by mode. The system may be configured to automatically repeat the above sequence and go into sleep mode after each time that another person sits down on the seat and the EA mechanism is re-adjusted.

Figure 7:
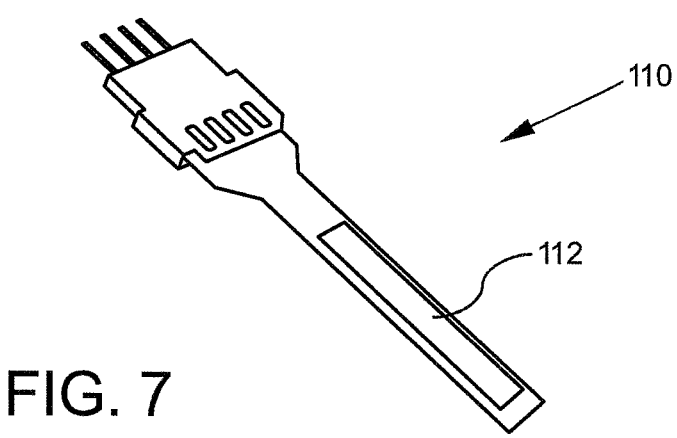
FIG. 7 is a perspective view of an exemplary cantilevered piezoelectric energy harvesting device.

Power to operate the system, or to charge a battery that powers the system, may be uniquely provided by harvesting energy from the vibrations and accelerations that occur naturally from normal vehicle operation. Referring to FIG. 7, vehicle motion energy may be harvested using a cantilevered piezoelectric device 110, mounted for example to the back of the seat (see FIG. 1). The device is configured with appropriate mass and flexibility to oscillate in response to road or motor induced vibrations transmitted to the seat under typical driving conditions. The oscillations generate electricity through repeated flexing of an integral or embedded piezoelectric layer 112. One or more such devices may be employed, with the devices oriented in one or more directions. For example, an installation may comprise three cantilever devices 110, each oriented perpendicular to the other two, or in x-y-z directions.

Instead of powering the components directly from the energy harvesting device, the harvested energy may be used to charge a rechargeable battery that powers the seating system components. Charging may be carried out automatically with a suitable charging cable or circuit configured to provide an appropriate charging current to the battery. In one embodiment the charging circuit is an integral element of a control board or CPU containing some or all of the electronic components of the system, such as the signal processor.

Figure 8:
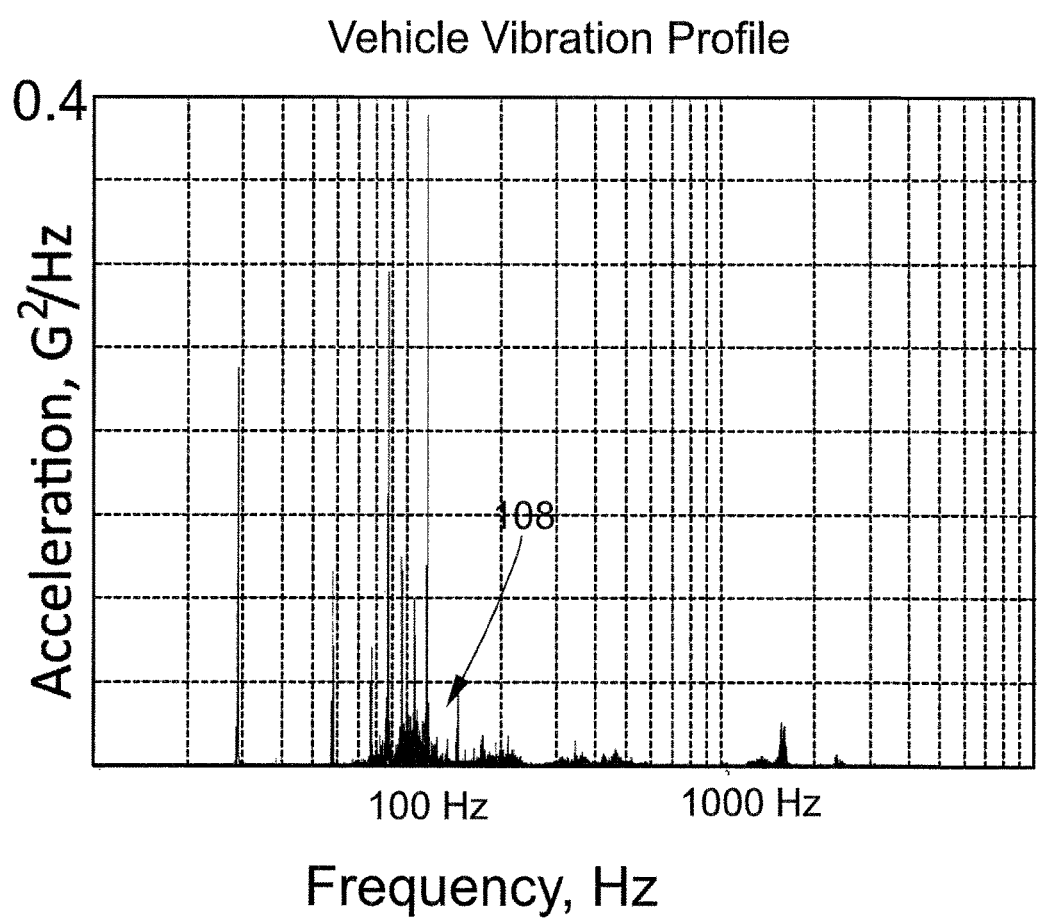
FIG. 8 is a plot of actual vehicle vibration data showing a peak energy region in the vibration profile.

An example of a suitable commercially available cantilever device 110 is the Volture V22B piezo device marketed by Mide Technology Corp. of Medford Mass. Feasibility of using the Volture device to charge a suitable power source for the electronic EA system was evaluated analytically using actual vehicle vibration data. FIG. 8 depicts a typical vibration profile of a driver seat in the US Army's M88 Recovery Vehicle travelling at 20 km/hr averaged over a variety of road surfaces and terrains. The data plot shows a region of peak energy, indicated at reference numeral 108, of approximately 100 Hz. By tuning the Volture V22B device to 100 Hz (which may or may not be the region of peak energy at other vehicle speeds), the analysis shows that the device could produce about 650 milli-joules per hour, enough energy to run the processing elements of the system, and to adjust the seat up to nine times per hour.

Figure 9:
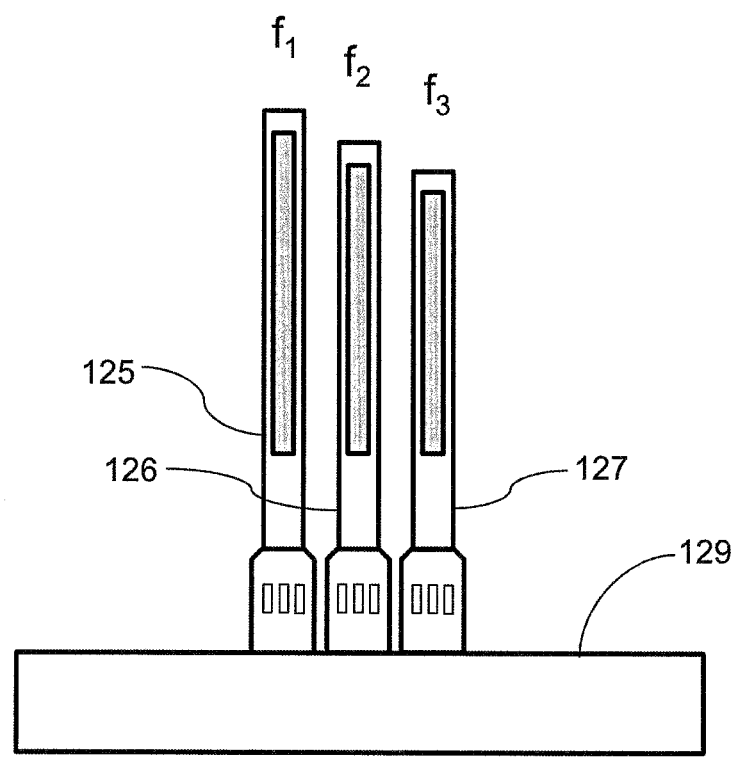
FIG. 9 depicts three cantilevered piezoelectric energy harvesting devices mounted side by side, each device tuned to a different frequency.

Thus, the efficiency of the energy harvesting system may be optimized by utilizing a device that is tuned to match a certain driving frequency imparted by the vehicle. If the vehicle vibration profile exhibits a peak energy frequency region that does not vary appreciably with changes in vehicle driving speed or engine speed, power may be efficiently generated with an energy harvesting device, or devices, tuned to that frequency. However, if the vehicle vibration profile exhibits multiple energy peaks, or if the frequency of the peak energy region varies with vehicle driving speed or engine speed, it may be advantageous to employ a plurality of energy harvesting devices, each tuned to a different frequency. FIG. 9 depicts an example of such a system wherein three cantilever type piezoelectric devices 125, 126, 127, tuned to frequencies $f_1$, $f_2$, $f_3$, respectively, are ganged together in a side-by-side mounting to the vehicle or seat structure 129. A multiple device system of this type may be used to passively cover a wider range of driving frequencies without the added complexity of adjustability.

Figure 10:
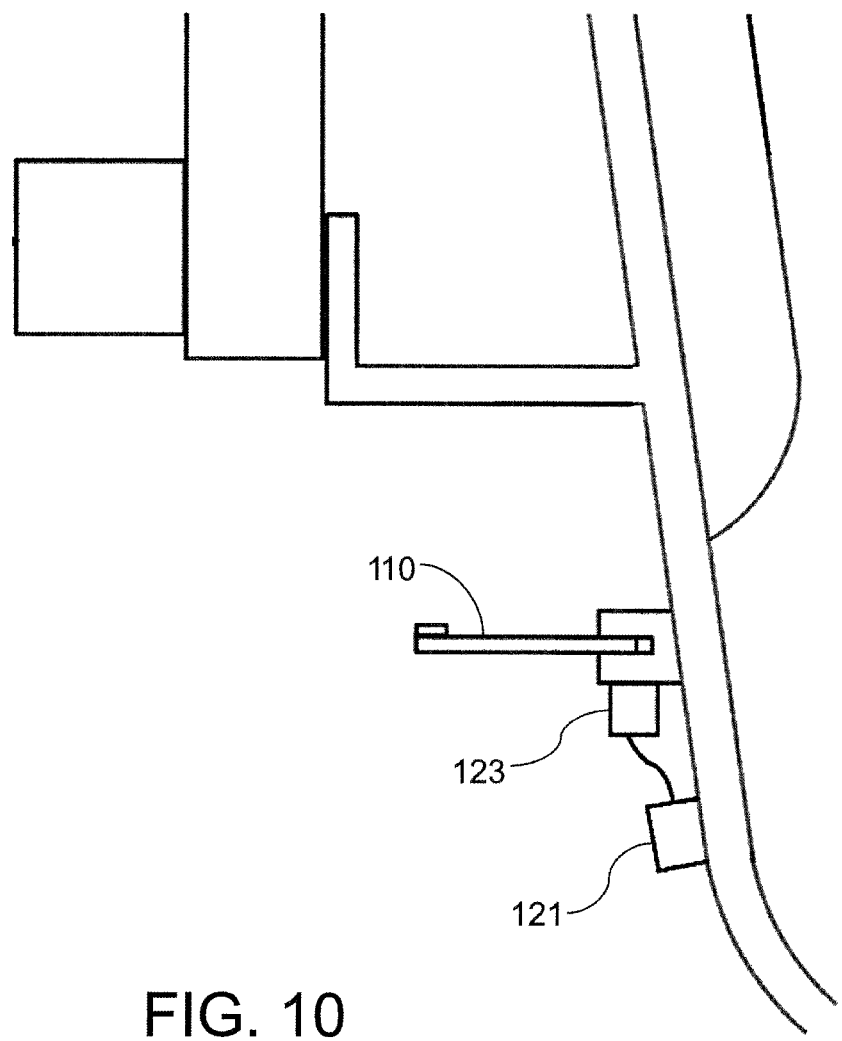
FIG. 10 depicts an energy harvesting device configured to automatically tune itself to real time vehicle vibration data.

Alternatively, the energy harvesting system may include the capability to detect the vehicle vibration profile in real time, and automatically tune itself to match the peak energy region of the profile. Referring to FIG. 10, the vibration profile of the vehicle is sampled in real time with a vibration sensor 121 that may be mounted to the seat, or packaged with other components of the energy harvesting or automatic energy attenuating systems. A tuning control 123 identifies a peak in the real time vibration profile, and automatically adjusts the natural frequency of the energy harvesting device to match the peak. The tuning control may include a processor configured to generate an adjustment signal corresponding to the peak in the vibration profile, and a motor that uses the signal to adjust a physical parameter of the energy harvesting device related to the natural frequency, such as weight, length, material stiffness, or damping. For example, a cantilevered type device may be mounted in an adjustable clamp that allows for changing the cantilevered length. The tuning control and sensor may be combined with the energy harvesting device in one integrated unit, that may itself be integrated or packaged with the electronic energy attenuating system.

Although described in terms of powering the electronic EA system, a frequency optimized piezoelectric energy harvesting device may be advantageously employed to charge and operate various other vehicle or vehicle seat electronic and electro-mechanical systems with relatively low or intermittent power needs. Examples include environmental, navigation, communication, internet, entertainment, head up display, and seat or mirror adjustment systems.

Figure 11:
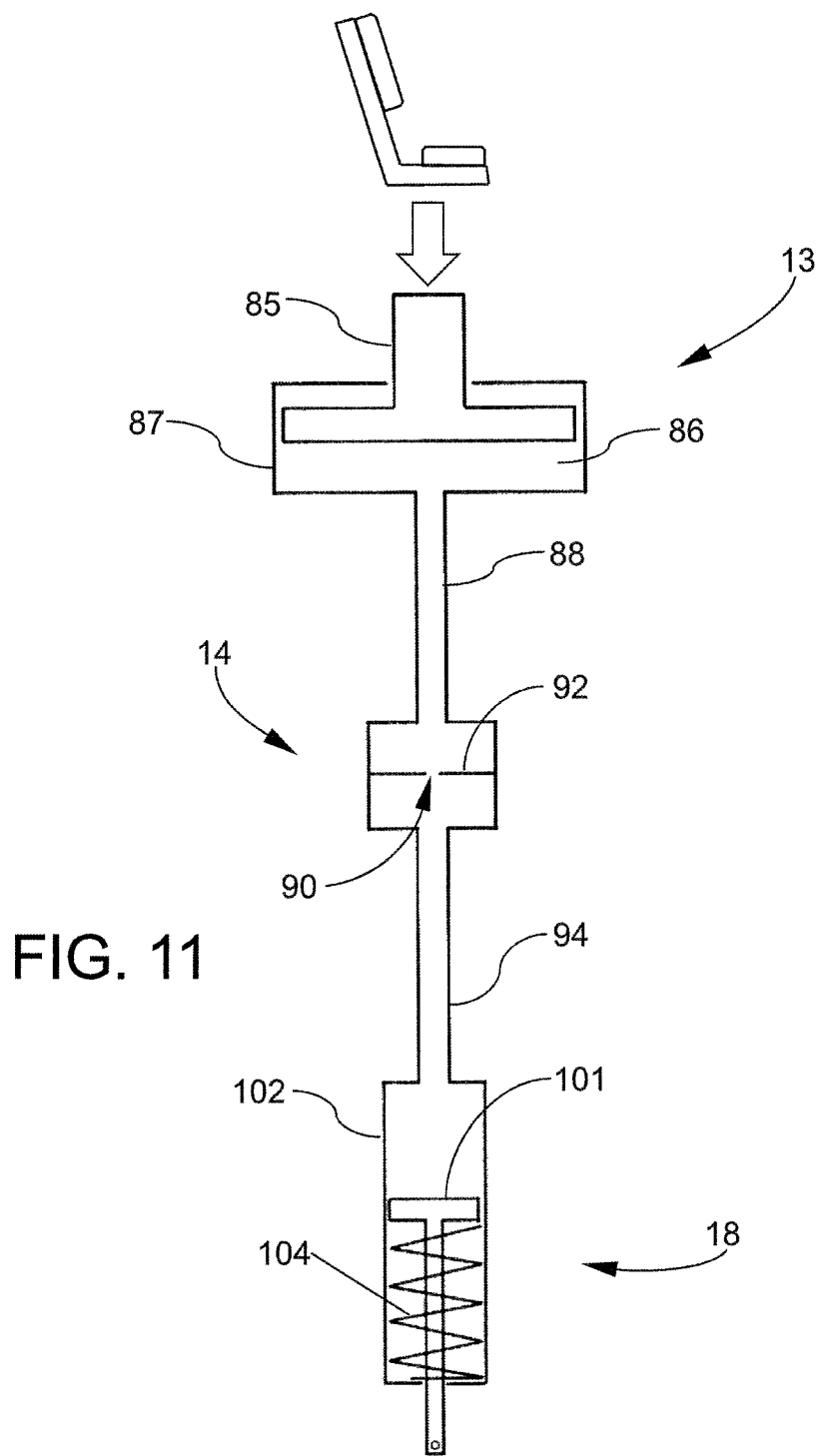
FIG. 11 is a schematic representation of an exemplary mechanical embodiment of the automatic energy attenuating seating system.

Referring now to FIG. 11, an exemplary mechanical embodiment of the automatic system is schematically depicted, again identifying the fundamental elements of the system such as weight detector, signal processor, etc. with the previously assigned reference numerals. In this embodiment the weight detector 13 comprises a first piston 85 in a first cylinder 87 filled with a suitable hydraulic fluid 86. The weight of an occupant sitting in the seat is transferred directly to the first piston 85, such as through a seat pan attached to the piston, thereby causing the first piston to compress the hydraulic fluid 86. Alternatively, the first piston and cylinder could be disposed in a load path between the seat and the EA device, or between the EA device and the supporting vehicle structure, whereby the entire weight of the seat and the seated occupant are transferred to the first piston.

The real time weight signal 16 is in the form of compressed hydraulic fluid 86 directed by a first conduit 88 to a signal processor 14 configured as a flow restricting device. In one embodiment the flow restricting device comprises an orifice 90 in a baffle 92 positioned in the fluid path. The orifice functions as a low pass filter by restricting fluid flow, and thereby increasing the time required to equalize pressure across the orifice. By proper sizing of the orifice, variations in the hydraulic pressure caused by high frequency variations in the seat loading, such as from vehicle movement or engine vibration, are effectively removed from the hydraulic signal.

The EA adjustment signal is also in the form of compressed hydraulic fluid in a second conduit 94 that connects the signal processor 14 to the actuator 18. In this embodiment the actuator comprises a second piston 101 in a second cylinder 102, and a compression spring 104. The pressurized hydraulic fluid displaces the piston until the pressure force of the fluid and the resisting force of the compression spring reach a balance. The second piston is connected to the load setting device of the EA mechanism, such as to stop 20 (not shown), and thus determines the adjustment or initial gap appropriate for the particular seated occupant.

When connected to a stop 20, the second piston 101 may be configured in the manner of FIG. 1, where the path of movement of the piston and the EA slider are parallel or aligned with one another, or in the manner of FIG. 3 with the piston and stop moving perpendicular to the slider path. When aligned as in FIG. 1, the instantaneous loading from the EA slider in a high energy loading event is reacted directly by the piston 101 instead of by a separate structural member. Since the hydraulic fluid is incompressible, in order for the piston 101 to move, it must force hydraulic fluid back through the orifice 90. If the area of the orifice is small enough, the piston will be unable to force any appreciable amount of fluid through the orifice in the brief time frame of a high energy loading event. Thus through proper sizing of the orifice, the position of the EA slider and roller will remain substantially fixed by the second piston 101 during the event. In any case the area of orifice 90 is substantially less than the cross sectional area of the fluid conduits 88, 94, and may be an order of magnitude less, or even smaller.

Since fluid must be displaced by the first piston to move the second piston and adjust the EA mechanism, some of the available seat stroking distance is lost in the adjustment process. It is therefore desirable for the first piston to displace the necessary volume of fluid with as little stroke as possible. On the other hand, the second piston may require a relatively long stroke to provide adequate range of motion for the stop 20, depending on the particular actuator and stop arrangement. Because both pistons operate on the same fluid volume, the ratio of the stroke lengths of the two pistons is proportional to the ratio of the piston areas. Since the piston area is determined by the piston diameter, a desired stroke length ratio may be obtained by proper selection of piston diameters. Or, knowing both stroke lengths and one piston diameter, the other piston diameter may be determined.

For example, assuming desired stroke lengths of 0.5 and 4.5 inches for the first and second pistons respectively, and a diameter of 1 inch for the second piston, the required diameter of the first piston would be 3 inches. As an alternative to one large diameter first piston, several smaller diameter pistons could be used instead, such as under the corners of a seat pan. Although shown as separate components, it should be appreciated that the pistons and filter could be configured compactly in one small unit, or together with the EA mechanism on the back of the seat or elsewhere.

For the purposes of describing and defining the present invention it is noted that the use of relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

Exemplary embodiments of the present invention are described above. No element, act, or instruction used in this description should be construed as important, necessary, critical, or essential to the invention unless explicitly described as such. Although only a few of the exemplary embodiments have been described in detail herein, those skilled in the art will readily appreciate that many modifications are possible in these exemplary embodiments without materially departing from the novel teachings and advantages of this invention. Accordingly, all such modifications are intended to be included within the scope of this invention as defined in the appended claims.

In the claims, any means-plus-function clauses are intended to clamp the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Unless the exact language "means for" (performing a particular function or step) is recited in the claims, a construction under § 112, 6th paragraph is not intended. Additionally, it is not intended that the scope of patent protection afforded the present invention be defined by reading into any claim a limitation found herein that does not explicitly appear in the claim itself.

What is claimed is:

1. A self adjusting energy attenuating vehicle seating system configured to automatically compensate for variations in seat occupant weight, the seating system comprising:
   a seat mounted in a vehicle and configured to stroke in a downward direction, generally toward a floor of the vehicle;
   a plastic deformation type energy attenuating device with a plastically deformable member disposed in a load path between the seat and a rigid structural portion of the vehicle, wherein the plastically deformable member is rigid and un-deformed under normal conditions;
   an adjustable load setting feature that determines a threshold load that must be applied by the seat to the plastically deformable member in a high energy loading event for the plastically deformable member to begin to plastically deform, and for the seat to begin to stroke toward the vehicle floor;
   a weight detector configured to detect a seat weight force, and output a real time weight signal;
   a signal processor configured to remove artifacts in the weight signal attributable to vehicle operation or occupant motion, and output an energy attenuator adjustment signal corresponding to the weight of an occupant; and
   an actuator configured to receive the energy attenuator adjustment signal and position the load setting feature accordingly.

2. The seating system of claim 1, wherein the weight detector comprises a transducer, and the weight signal is an electronic signal.

3. The seating system of claim 2, wherein the signal processor comprises a nonlinear digital filter that outputs a filtered signal.

4. The seating system of claim 3, wherein the signal processor further comprises:
   a static weight algorithm that calculates the weight of a seated occupant from the filtered signal; and
   a look-up table that operates to select and output an adjustment instruction using the calculated weight.

5. The seating system of claim 2, wherein the actuator is a solenoid or servo type device configured to adjust the load setting feature based on the energy attenuator adjustment signal.

6. The seating system of claim 5, further comprising an energy harvesting device attached to the seat and configured to generate electricity in response to road or motor induced vibrations transmitted through the vehicle to the seat during vehicle operation.

7. The seating system of claim 6, wherein the energy harvesting device is a cantilevered piezoelectric device that oscillates in response to an input vibration.

8. The seating system of claim 6, wherein electricity generated by the energy harvesting device charges a battery that provides electrical power to the seating system.

9. The seating system of claim 1, wherein the energy attenuating device is a wire bender type device comprising a series of rollers in a housing, and the deformable member is an elongated rod extending through the housing and around the rollers, and further wherein one of the series of rollers is movable in a direction perpendicular to the elongated rod.

10. The seating system of claim 9, wherein the load setting device comprises a stop attached to the actuator and moveable to a position juxtaposed with the moveable roller to thereby define an initial gap between the stop and roller.

11. The seating system of claim 10, wherein the roller is mounted on a sliding bar that slides in the housing in a direction perpendicular to the elongated rod, and the initial gap is between the stop and an end of the sliding bar.

12. The seating system of claim 11, wherein the actuator moves the stop in a direction perpendicular to the direction of movement of the roller, and wherein the stop is wedge shaped, having a straight side parallel to the direction of movement of the stop, and an angled side facing the end of the sliding bar.

13. The seating system of claim 12, wherein the angled side of the stop presents a series of steps, each step contoured to fit an end shape of the sliding bar.

14. The seating system of claim 1, wherein the weight detector comprises a first piston in a first cylinder configured to compress a hydraulic fluid in response to the input seat weight force, and the actuator comprises a second piston in a second cylinder fluidly connected by a conduit to the first cylinder, such that displacement of the first cylinder results in a proportional displacement of the second cylinder.

15. The seating system of claim 14, wherein the signal processor comprises a flow restriction device in the conduit.

16. The seating system of claim 15, wherein the flow restriction device comprises an orifice in a baffle, the orifice sized to act as a low pass filter restricting fluid flow and thereby removing variations in the hydraulic pressure occurring at a frequency above a pre-determined threshold frequency corresponding to variations caused by vehicle operation or seat occupant movement.

17. A self adjusting energy attenuating vehicle seating system configured to automatically compensate for variations in the weight of seated occupants, the seating system comprising:
 a seat mounted in a vehicle and configured to stroke in a downward direction, generally toward a floor of the vehicle;
 a plastic deformation type energy attenuating device disposed in a load path between the seat and a rigid structural portion of the vehicle, wherein the energy attenuating device is rigid and un-deformed under normal conditions;
 a load setting feature that determines a threshold load that must be applied by the seat to the energy attenuating device in a high energy loading event for the energy attenuating device to begin to plastically deform, and for the seat to begin to stroke toward the vehicle floor;
 a signal processor configured to remove variations in a seat weight signal attributable to vehicle or occupant motion, and output an energy attenuator adjustment signal corresponding to the weight of a seated occupant; and
 an actuator configured to receive the energy attenuator adjustment signal and adjust the load setting feature accordingly.

18. The vehicle seating system of claim 17, further comprising a weight detector configured to detect a seat weight force, and output the seat weight signal.

19. The vehicle seating system of claim 18, wherein the weight detector is a transducer, the weight signal is an electronic signal, and the actuator is a solenoid type device.

20. The vehicle seating system of claim 18, wherein the signal processor comprises a nonlinear digital filter.

21. The vehicle seating system of claim 18, wherein the weight detector is a first piston in a first cylinder, the weight signal is a compressed hydraulic fluid, and the actuator is a second piston in a second cylinder connected to the first piston by a conduit.

22. The vehicle seating system of claim 21, wherein the signal processor is a flow restriction in the conduit.

23. The seating system of claim 19, wherein electrical power is provided by an energy harvesting device attached to the seat and configured to generate electricity in response to road or motor induced vibrations transmitted through the vehicle to the seat during vehicle operation.

24. The seating system of claim 23, wherein the energy harvesting device is a cantilevered piezoelectric device that oscillates in response to an input vibration.

* * * * *